Figure 2:
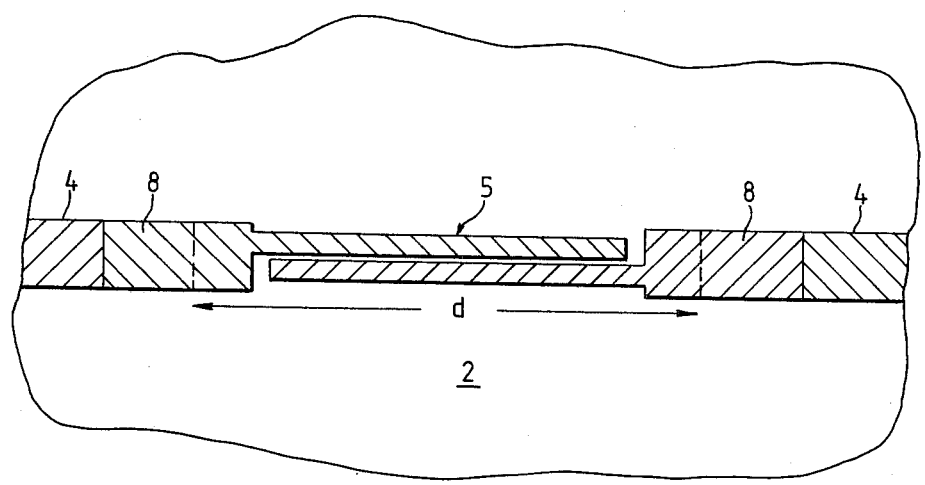

United States Patent [19]

England

[11] 4,329,779

[45] May 18, 1982

[54] METHODS OF APPLYING CIRCUIT ELEMENTS TO A SUBSTRATE

[75] Inventor: Eric H. England, Swindon, England

[73] Assignee: National Research Development Corporation, London, England

[21] Appl. No.: 123,773

[22] Filed: Feb. 20, 1980

[30] Foreign Application Priority Data

Feb. 26, 1979 [GB] United Kingdom ............... 7906701

[51] Int. Cl.³ .............................................. H05K 3/34
[52] U.S. Cl. ........................................ 29/840; 29/832; 156/241
[58] Field of Search ................ 29/840, 832, 846, 835; 156/241, 249, 630; 333/204; 361/400

[56] References Cited

U.S. PATENT DOCUMENTS

| | | | |
|---|---|---|---|
| 2,794,788 | 6/1957 | Coover, Jr. et al. | 156/157 X |
| 3,456,335 | 7/1969 | Hennings et al. | 29/832 X |
| 3,566,315 | 2/1971 | Vinding | 333/204 |
| 3,605,045 | 9/1971 | Ramsbotham, Jr. | 333/204 |
| 3,614,832 | 10/1971 | Chance et al. | 29/846 X |
| 3,711,778 | 1/1973 | Day | 333/247 X |
| 3,762,040 | 10/1973 | Burns et al. | |
| 3,859,723 | 1/1975 | Hamer et al. | 29/840 |

FOREIGN PATENT DOCUMENTS

| | | |
|---|---|---|
| 2065090 | 7/1971 | France . |
| 1137907 | 12/1968 | United Kingdom . |
| 1185857 | 3/1970 | United Kingdom . |
| 1199231 | 7/1970 | United Kingdom ................ 361/400 |
| 1258660 | 12/1971 | United Kingdom . |
| 1315510 | 5/1973 | United Kingdom . |
| 1525148 | 9/1978 | United Kingdom . |

Primary Examiner—Francis S. Husar
Assistant Examiner—C. J. Arbes
Attorney, Agent, or Firm—Cushman, Darby & Cushman

[57] ABSTRACT

A method of applying microelectronic circuit elements, such as high definition thin-film microwave components, typically to a lower definition thick film or printed circuit board substrate. The method described involves the formation of a high definition microwave filter on the surface of a transparent, flexible carrier substrate using thin film deposition techniques, and the circuit element is then adhesive bonded face down in an appropriate position in a thick film circuit on the surface of a second, permanent substrate. The thin film circuit element is formed with contact areas which overlap cooperating portions of the thick film circuit on insertion of the circuit element to provide electrical connections. The carrier substrate may then be removed, eg by dissolving, and the overlapping contact areas may be permanently bonded together. Thus only the high definition parts of the micro-circuit need be fabricated using expensive thin film technology.

18 Claims, 5 Drawing Figures

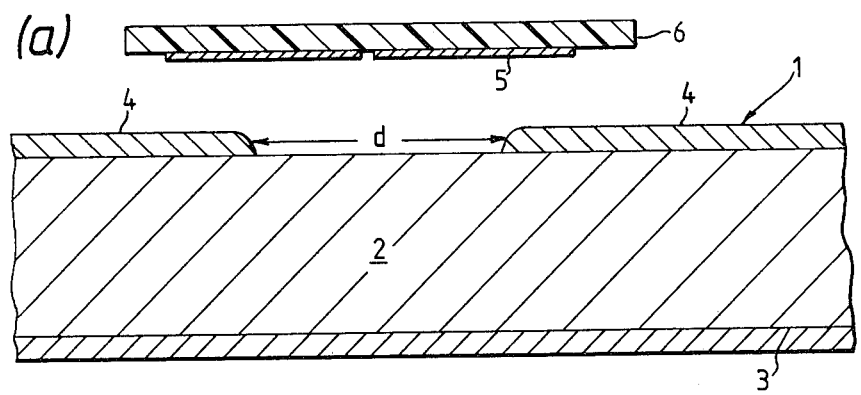
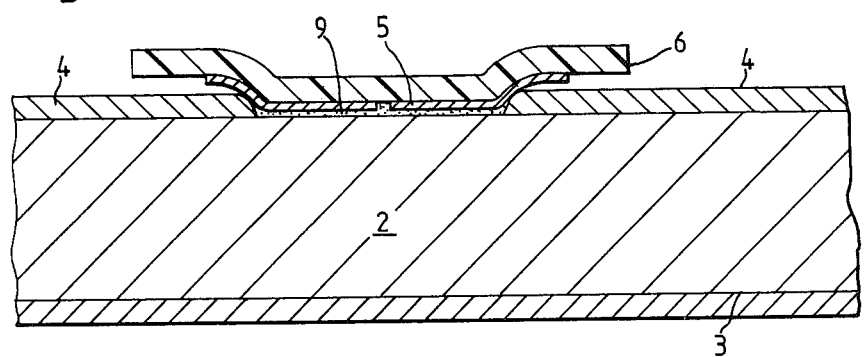
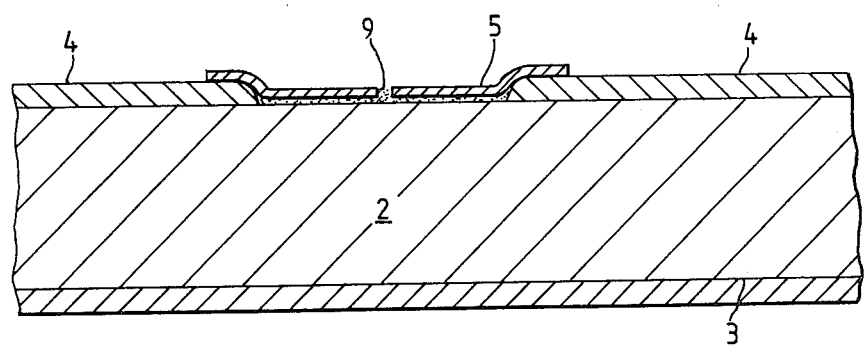

METHODS OF APPLYING CIRCUIT ELEMENTS TO A SUBSTRATE

This invention relates to methods of applying circuit elements to a substrate.

The invention is particularly concerned with microwave microelectronic circuits or microwave integrated circuits (MICs) of the kind in which a number of active and/or passive circuit elements and their interconnecting patterns are formed on a single substrate, usually of a material having a relatively high dielectric constant, such as high alumina ceramics material whose dielectric constant is about 10. Other typical substrates include sapphire, beryllia and ferrite.

MICs of this kind are generally fabricated by either thin film technology or thick film technology. Thin film technology generally involves the deposition in a vacuum, of thin films of conductive, resistive or insulating materials by sputtering, evaporation or chemical vapour deposition. Thick film technology on the other hand involves the deposition of pastes, or "inks", usually by a silk screen process followed by firing at high temperature. Where different types of pastes are used, eg to give resistors, conductors or insulating layers, more than one cycle of screen printing and firing is usually required. Further definition of the screen-printed pattern can be effected by etching back after firing.

Thick film technology has the advantage of being relatively inexpensive, particularly in quantity production, but the screen printing process used for printing the thick film patterns has inherent limitations on the precision with which patterns can be defined. Conductor line widths can only be produced to an accuracy of approximately 20 μm at best, and the line edges may be somewhat irregular unless etching or laser trimming is used. Minimum line widths and line spacing are generally both limited to approximately 40 μm.

Thus, distributed circuit elements that require precise complex geometries and high definition, such as filters and couplers cannot be obtained using thick film techniques. As a result where such elements are required, the MIC has generally had to be fabricated using the more expensive, labour-intensive thin film technology, as this technique enables the desired definition to be achieved.

According to the present invention, a method of applying a circuit element to a substrate comprises forming the circuit element on the face of a carrier substrate, placing the carrier substrate face down onto the surface of a second substrate and attaching the circuit element to the second substrate.

Preferably the circuit element is formed by thin film fabrication techniques, and may comprise a metallisation pattern defining a distributed microwave circuit element such as a filter.

The second or main substrate may comprise a thick film substrate, a thin film substrate or a printed circuit board. Thus, it will be seen, the invention enables individual high definition circuit elements formed by thin film circuit techniques to be inserted in a partially completed circuit otherwise fabricated using lower definition techniques, such as thick film, lower definition thin film, or printed circuit board techniques.

The circuit element may be attached to the second or main substrate using an adhesive, excess adhesive preferably being exuded before setting by applying pressure between the two substrates.

Preferably the carrier substrate is removed after attachment of the circuit element to the second substrate, for example, by dissolving, etching or peeling, following which any required electrical connections between the circuit element and other circuitry carried on the second substrate may be made.

In this regard the circuit element may be attached in a position adjacent an existing conductor pattern on the second substrate, and electrical connection made therebetween by tape or wire bonding, or soldering. Alternatively, the circuit element may be formed with one or more contact areas which, when located on the second substrate, overlap contact areas provided in the second substrate. Following removal of the carrier substrate, the overlapping contact areas may be electrically connected eg by ultrasonic bonding or conductive adhesive.

To facilitate location of the circuit element on the second substrate, the carrier substrate is preferably transparent, and may also be flexible to facilitate removal of excess adhesive, where adhesive is used to attach the circuit element to the second substrate. In some applications the second substrate itself may be transparent In a preferred embodiment, the carrier substrate is a biaxially orientated polystyrene material, being transparent and readily available in flexible sheet form. A cyano-acrylate adhesive may then be used as the attachment adhesive and the carrier substrate subsequently removed using a suitable hydrocarbon solvent.

The invention also extends to circuit substrates incorporating one or more circuit elements applied thereto by a method as aforesaid.

The invention will now be described, by way of example only, with reference to the accompanying drawings, of which:

FIGS. 1(a) to 1(d) show diagrammatic sectional views of various stages in a method in accordance with the present invention of transferring a pre-formed thin film circuit element onto a thick film circuit substrate; and FIG. 2 shows a diagrammatic plan view of the thin film circuit element located on the thick film circuit substrate.

Referring to the drawings, FIG. 1 shows part of a thick film microwave integrated circuit (MIC) 1 comprising a substrate 2 of high dielectric constant material, such as alumina, formed in known manner with a ground plane conductor 3 on one surface and on its other surface with a thick film microwave circuit pattern including a strip transmission line (microstrip line) 4. The microstrip line 4 is formed with a gap d for receiving a pre-formed high definition distributed microwave circuit element 5.

The circuit element 5, in this example a parallel gap filter (see FIG. 2) is formed using standard thin film techniques, on a carrier substrate 6 (FIG. 1(a)) comprising a 250 μm thick flexible sheet of clear biaxially orientated polystyrene material, such as that sold under the Registered Trade Mark "POLYFLEX". A number of identical such metallised circuit elements may be deposited on a common piece of carrier substrate using step and repeat processes, and the carrier substrate then cut up into individual "chip" form.

The circuit element 5 is then attached to the thick film substrate 2 by placing the carrier substrate 6 onto the thick film circuit substrate 2 in a suitably aligned position across the gap d in the transmission line 4, such that contact areas 8 (FIG. 2) of the circuit element 5 overlap the ends of the transmission line 4, a layer 9 of a suitable adhesive being applied between the substrate 2 and the parts of the circuit element 5 which do not overlap the transmission line 4. (FIG. 1(b)). The alignment of the circuit element 5 is facilitated by the transparency of the carrier substrate material. Excess adhesive between the contact element 5 and the substrate 2 is exuded by squeezing the flexible carrier substrate 6 against the thick film substrate 2 using, for example, a resilient roller whose width is slightly smaller than the width of the gap d. The adhesive is then set and the carrier substrate 6 removed by dissolving it in a suitable solvent which does not attack the adhesive. (FIG. 1(c)). Suitably trichloroethylene may be used as the solvent, with a cyano-acrylate adhesive which appears to combine good microwave properties with a resistance to attack by the solvent.

With the carrier substrate removed, the unattached contact areas 8 of the circuit element 5 which now loosely overlap the ends of the transmission line 4, may then be permanently connected to the transmission line using any suitable electrical bonding technique such as ultrasonic bonding. However, this is not essential. In the example of FIG. 2 which shows a dc blocking filter, no electrical bonding is necessary as the overlap areas provide sufficient, probably capacitive, coupling to the filter at operating frequencies.

In an alternative method the entire circuit element 5 may be attached to the thick film substrate 2 without any overlap with the transmission line, and with contact areas positioned adjacent the ends of the transmission line 4 so that they can be electrically connected by conventional wire or tape bonding techniques.

Because the carrier substrate is removed, standard microstrip design data can be used for design purposes because there is minimal disturbance of the microstrip environment.

The invention thus enables precision circuit elements having the high definition achievable with thin film fabrication techniques to be incorporated in circuits made by methods which do not achieve the same precision, such as thick film circuits, low definition thin film circuits and copper laminate type printed circuit boards such as Polyguide (Registered Trade Mark) for microwave applications. Such precision circuit elements may be produced on individual carrier substrates, ie in "chip" form, and used in similar manner to known chip devices. Thus different complex circuit functions can be made available for incorporation on a common circuit substrate design to obtain different operating characteristics.

In some applications the carrier substrate need not be removed. One such application of the invention in which it may even be desirable to retain the carrier substrate is in stub tuning of MICs. At present only destructive "one way" trimming of fixed position stubs is possible. However, by forming a suitably dimensioned open circuit stub line on a carrier substrate, eg a sheet of biaxially oriented polystyrene as before, this substrate can then be positioned face down onto the appropriate part of a transmission line and adjusted in position to obtain the desired characteristic. Metal-to-metal contact between the transmission line and the stub formed on the carrier substrate is normally satisfactory for test purposes during adjustment, which can be effected to vary the length of the stub and its position along the transmission line. Once the correct positional and lengthwise adjustments have been obtained, adhesive is applied to the non overlapping region of the stub line and the stub line attached to the transmission line substrate in the desired position. Permanent electrical connection between the overlapping regions of the stub line and transmission line may then be effected using a conductive adhesive.

Thus problems of de-tuning as a result of removal of the carrier substrate are avoided. To facilitate handling of the carrier substrate during adjustment, it may be temporarily attached to a low dielectric constant "probe", for example of foam polystyrene, which is removed after attachment of the stub to the transmission line circuit.

Although in the described embodiment the carrier substrate is of transparent flexible sheet material, removed by dissolving in a suitable solvent, the invention is not limited to carrier substrates of this type. Although the use of a transparent carrier substrate is advantageous for alignment purposes, it is not essential and non-transparent substrates may be used. Similarly, the use of a flexible carrier substrate is useful, particularly where areas of the circuit element formed thereon are required to overlap metallised areas on the receiving substrate, the use of flexible carrier substrates is not essential.

Furthermore, it is envisaged that other methods of removing the carrier substrate may be used. For example, the carrier substrate may be removed by etching or it may simply be peeled off depending on the form of carrier substrate and the materials used. Similarly other forms of adhesive may be used to attach the circuit element to the second substrate.

What I claim is:

1. A method of incorporating a distributed microwave circuit element in a microwave integrated circuit comprising:
   providing the circuit element defining a face on a given surface of a first, carrier substrate, formed by a high-definition thin-film technique;
   providing a second substrate on which said integrated circuit is to be formed, said second substrate carrying a conductive planar microcircuit pattern formed by a low-definition technique and having a gap in the pattern for incorporation of said element;
   placing said given surface of the carrier substrate in contact with the surface of the second substrate adjacent said gap;
   attaching the circuit element to the surface of the second substrate; and
   providing an electrical connection between said element and the conductive pattern.

2. A method as is claimed in claim 1 wherein the circuit element is a filter.

3. A method as claimed in claim 1 wherein the carrier substrate is removed following attachment of the circuit element to the second substrate.

4. A method as claimed in claim 3, wherein the carrier substrate is removed by dissolving or etching.

5. A method as claimed in claim 1, wherein the second substrate comprises a thick film microelectronic circuit substrate on which the conductive circuit pattern is formed by a thick film fabrication technique.

6. A method as claimed in claim 1, wherein the second substrate comprises a microelectronic printed circuit board on which the circuit pattern is formed by etching.

7. A method as claimed in claim 3, wherein permanent electrical connection is provided between the circuit element and the conductive circuit pattern by means of one or more bridging electrical connections.

8. A method as claimed in claim 7, wherein the or each bridging electrical connection is formed by tape or wire bonding, or soldering.

9. A method as claimed in claim 1, wherein the circuit element is formed on the face of the carrier substrate with one or more metallised contact areas which, when the circuit element is located on the second substrate, overlap respective contact areas provided by the conductive circuit pattern on the surface of the second substrate.

10. A method as claimed in claim 9, wherein following attachment of the circuit element to the surface of the second substrate, the carrier substrate is removed, and the overlapping contact areas of the circuit element and conductive circuit pattern are permanently electrically connected.

11. A method as claimed in claim 9, wherein the following attachment of the circuit element to the surface of the second substrate, no permanent electrical connection is provided between the loosely overlapping contact areas of the circuit element and the conductive circuit pattern, the loose engagement between these areas providing sufficient radio frequency coupling between the circuit and the circuit element.

12. A method as claimed in any one of claims 1 or 2, wherein the carrier substrate is flexible.

13. A method as claimed in any one of claims 1 or 2, wherein the carrier substrate is transparent.

14. A method as claimed in any one of claims 1 or 2, wherein the circuit element is attached to the surface of the second substrate using an adhesive.

15. A method as claimed in claim 14, wherein excess adhesive is exuded before setting by applying pressure between the two substrates.

16. A method as claimed in claim 12, wherein the carrier substrate is of biaxially oriented polystyrene material.

17. A method as claimed in claim 16, wherein the circuit element is attached to the surface of the second substrate using a cyano-acrylate adhesive.

18. A method as claimed in claim 17, wherein the carrier substrate is removed after attachment of the circuit element to the second substrate, by means of hydrocarbon solvent.

* * * * *

UNITED STATES PATENT AND TRADEMARK OFFICE
CERTIFICATE OF CORRECTION

PATENT NO. : 4,329,779
DATED : May 18, 1982
INVENTOR(S) : ENGLAND

It is certified that error appears in the above—identified patent and that said Letters Patent is hereby corrected as shown below:

Claim 1, line 4, delete "defining a face".

Signed and Sealed this

Sixteenth Day of November 1982

[SEAL]

Attest:

Attesting Officer

GERALD J. MOSSINGHOFF

Commissioner of Patents and Trademarks